United States Patent [19]
Gutentag

[11] Patent Number: 5,960,961
[45] Date of Patent: Oct. 5, 1999

[54] TAB MEANS TO ASSURE READY RELEASE OF SINGULATED WAFER DIE OR INTEGRATED CIRCUIT CHIPS PACKED IN ADHESIVE BACKED CARRIER TAPES

[75] Inventor: Charles Gutentag, Los Angeles, Calif.

[73] Assignee: Tempo G, Sherman Oaks, Calif.

[21] Appl. No.: 09/128,306

[22] Filed: Aug. 3, 1998

[51] Int. Cl.⁶ .................................................. B65D 85/00
[52] U.S. Cl. .......................................... 206/714; 206/716
[58] Field of Search ................................... 206/713–717, 206/820, 328–332; 20/334

[56] References Cited

U.S. PATENT DOCUMENTS

| | | |
|---|---|---|
| 2,888,849 | 5/1959 | Wohlman Jr. . |
| 3,177,629 | 4/1965 | Anspach . |
| 3,608,711 | 9/1971 | Wiesler et al. . |
| 3,691,436 | 9/1972 | Maijers et al. . |
| 3,785,507 | 1/1974 | Weisler et al . |
| 3,881,245 | 5/1975 | Dudley et al. . |
| 3,971,193 | 7/1976 | Tardiff et al. . |
| 4,298,120 | 11/1981 | Kaneko et al. . |
| 4,340,774 | 7/1982 | Nilsson et al. . |
| 4,575,995 | 3/1986 | Tabuchi et al. . |
| 4,724,954 | 2/1988 | Sillner . |
| 4,954,207 | 9/1990 | Higuchi et al. . |

Primary Examiner—Paul T. Sewell
Assistant Examiner—J. Mohandesi
Attorney, Agent, or Firm—Thomas I. Rozsa; Tony D. Chen; Jerry Fong

[57] ABSTRACT

A carrier tape system for receiving, retaining and quickly releasing small components, such as singulated bare die, integrated circuit (IC) chips, or other small components for automated assembly processing. The carrier tape system is comprised of a longitudinal elongated flexible punched carrier tape frame and a solid width of pressure sensitive adhesive (PSA) tape affixed to one side of the carrier tape frame. The punched carrier tape frame has a plurality of spaced apart aperture cavities therethrough. The solid width of PSA tape also has a plurality of spaced apart configured apertures which are smaller than the plurality of aperture cavities of the punched carrier tape frame. These configured apertures of the PSA tape are centrally aligned and respectively located within the aperture cavities of the carrier tape frame. The perimeter of each configured aperture has a plurality of small protruding tabs which extend inwardly into each configure aperture for receiving, retaining and quickly releasing the small components therein. These small protruding tabs minimize adhesive contact to the small components contained within the aperture cavities of the carrier tape frame, and thereby enable quick release of the small components from the aperture cavities.

22 Claims, 2 Drawing Sheets

TAB MEANS TO ASSURE READY RELEASE OF SINGULATED WAFER DIE OR INTEGRATED CIRCUIT CHIPS PACKED IN ADHESIVE BACKED CARRIER TAPES

BACKGROUND OF THE INVENTION

1. Field of the Invention

The present invention generally relates to the field of automated packaging systems. More particularly, the present invention relates to the field adhesive backed carrier tape packaging systems utilizing a solid pressure sensitive adhesive (PSA) tape.

2. Description of the Prior Art

The following thirteen (13) prior art patents are found to be pertinent to the field of the present invention:

1. U.S. Pat. No. 2,885,849 issued to Wohlman, J R on May 12, 1959 for "Semiconductor Taping Apparatus" (hereafter the "Wohlman Patent");
2. U.S. Pat. No. 3,177,629 issued to Anspach on Apr. 13, 1965 for "Apparatus for Loading Components" (hereafter the "Anspach Patent");
3. U.S. Pat. No. 3,608,711 issued to Wiesler et al. on Sep. 28, 1971 for "Package for Electronic Devices and the Like". (hereafter the "'711 Wiesler Patent");
4. U.S. Pat. No. 3,691,436 issued to Maijers et al. on Sep. 12, 1972 for "Electrical Circuit Element having a Diagonal Abutment Strip and Method of Manufacturing the Same" (hereafter the "Maijers Patent");
5. U.S. Pat. No. 3,785,507 issued to Wiesler et al. on Jan. 15, 1974 for "Die Sorting System" (hereafter the "'507 Wiesler Patent");
6. U.S. Pat. No. 3,881,245 issued to Dudley et al. on May 6, 1975 for "Mounting Electrical Components On Thick Film Printed Circuit Elements" (hereafter the "Dudley Patent");
7. U.S. Pat. No. 3,971,193 issued to Tardiff et al. on Jul. 27, 1976 for "Machines For Sequencing Diverse Components" (hereafter the "Tardiff Patent");
8. U.S. Pat. No. 4,298,120 issued to Kaneko et al. on Nov. 3, 1981 for "Chip-Like Electronic Component Series And Method For Supplying Chip-Like Electronic Components" (hereafter the "Kaneko Patent");
9. U.S. Pat. No. 4,340,774 issued to Nilsson et al. on Jul. 20, 1982 for "Device For Mounting Circuit Components On A Circuit Board" (hereafter the "Nilsson Patent");
10. U.S. Pat. No. 4,575,995 issued to Tabuchi et al. on Mar. 18, 1986 for "Automatic Producing Apparatus Of Chip-Form Electronic Parts Aggregate" (hereafter the "Tabuchi Patent");
11. U.S. Pat. No. 4,724,954 issued to Sillner on Feb. 16, 1988 for "System For Conveying And Guiding Components, In Particular Electrical Construction Elements Which Are Held On A Belt In A Radially Or Quasi-Radially Belted Manner" (hereafter the "Sillner Patent");
12. U.S. Pat. No. 4,954,207 issued to Higuchi et al. on Sep. 4, 1990 for "Apparatus For Automatically Taping Electronic Components" (hereafter the "Higuchi Patent"); and
13. U.S. Pat. No. 5,203,143 issued to Gutentag on Apr. 20, 1993 for "Multiple And Split Pressure Sensitive Adhesive Stratums For Carrier Tape Packaging System" (hereafter the "'143 Patent").

The Wohlman Patent discloses a semiconductor taping apparatus. The semiconductors are taped at lateral ends by a pair of first tapes, and another pair of second tapes where the adhesives in the first tapes face the adhesive side of the tapes in the pair of second tapes.

The Anspach Patent discloses an apparatus for loading components. These components are primarily larger components and also are primarily leaded diodes. A gap is provided in the carrier where the heads of the transistors are placed, but the transistors themselves are carried by having the lead sandwiched between the carrier tape and an adhesive tape.

The '711 Wiesler Patent discloses a package for electronic devices and the like, which utilizes a tape with a plurality of openings to receive a device. The device is held in place by an adhesive tape applied from the back, which is exposed at the opening and serves as a tape stratum for holding the device in place.

The Maijers Patent discloses an electrical circuit element having a diagonal abutment strip and method of manufacturing the same. In the Maijers Patent, small discrete components are interconnected by means of a strip of tape.

The '507 Wiesler Patent discloses a die sorting system which uses a strip comprised of a relatively narrow strip formed with indexing holes along one edge, and storage holes near the outer edge of the strip. On the bottom side, a thin pressure sensitive adhesive tape is laminated to the strip and provides an adhesive floor to hold the die at the bottom of the storage holes.

The Dudley Patent discloses a device for mounting electrical components on thick film printed circuit elements. Two metal strips are attached to printed areas and adhered by electrical resistance welding for contacting electrodes.

The Tardiff Patent discloses machines for sequencing diverse components. In the Tardiff Patent, small electrical components are sequenced and interconnected with tape at opposite ends of their lead portions.

The Kaneko Patent discloses a chip-like electronic component series and method for supplying chip-like electron-iccomponents. It coomprises a tape-like member formed with a plurality of apertures with upper and lower cover sheets that contain small chip-like electronic components.

The Nilsson Patent discloses a device for mounting circuit components on a circuit board which includes apertures in the plate designed to hold by means of a friction fit.

The Tabuchi Patent discloses an automatic producing apparatus of chip-form electronic parts aggregate. It comprises a tape-like housing body which has a feed hole along the side and a frame type housing hole with a specific pitch between the housing holes.

The Sillner Patent discloses a system for conveying and guiding components, in particular electrical construction elements which are held on a belt in a radially or quasi-radially belted manner. The components are also held by tape at the ends of their leads.

The Higuchi Patent discloses an apparatus for automatically taping electronic components. The electronic components are placed on an elongated tape body at a regular pitch and an adhesive tape is applied to fix the electronic components in position. The electronic component is placed on an elongated first tape and by applying a second tape, the component is fixed between the two tapes.

The Sillner Patent discloses a system for conveying and guiding components, in particular electrical constuction elements which are held on a belt in a radially quasi-radially belted manner. The components in the Sillner Patent are also held by tape at the ends of their leads.

Historically, a solid band of pressure sensitive adhesive (PSA) tape is affixed to a punched plastic carrier tape frame. Integrated circuit (IC) chips on this solid band of PSA tape are sequentially and repeatably placed with the entire back side of each IC chip affixed to and covered by the PSA tape. Such means of adhesive attachment is equivalent to that which is used when the complete wafer from which the IC chips were obtained was prepared and processed for use on an adhesive matrix film mounted in a saw ring or frame. The shear forces encountered during sawing of the silicon wafer to singulate IC chips require 100% adhesion of the wafer to the PSA film to maintain accuracy and integrity of the saw cuts. Once sawn from the wafer and transferred to the adhesive backed carrier tape for storage and transport, individual IC chips are no longer subjected to high level of shear forces. Accordingly, 100% backside surface attachment of each wafer die to a solid band of PSA tape is not required to maintain secure attachment and retention of pre-positioned IC chip orientation. Furthermore, such 100% backside adhesion to the PSA tape is excessive and causes major problems when removing IC chips from the adhesive backed carrier tape. These problems include mispicks during automated high speed assembly placement of IC chips, physical and functional damage to the IC chips, and disorientation of the IC chip as originally placed on the adhesive backing, requiring elaborate positional correction of each IC chip prior to placement with requisite accuracy. The need for properly orienting each IC chip prior to placement is presently obtained by pick and place machines controlled by sophisticated and costly vision systems. Yet a greater cost penalty is experienced by slowing the speed of assembly placement with a resulting loss of throughput.

It is well know to those skilled in the art of singulating IC chips from sawn wafers that such singulation is best accomplished within a few hours after wafers have been sawn. The characteristics of PSA tapes used for sawing result in an increase in adhesion ranging approximately from 5 to 6 times the original adhesion level. Such increase occurs within an approximate two week period of time after sawing of the wafer affixed to PSA film tape which has been separated from a roll and exposed to ambient air. Accordingly, IC chips picked from a sawn wafer on adhesive film which has aged for two or more weeks will be subject to damage, including fracturing and chipping. Stresses in the silicon wafer chips are introduced when high levels of force must be applied to eject the IC chips from the adhesive based wafer during singulation. These stresses are bases for latent defects which are often undetectable during test of assembled circuits, yet cause failures in use after the circuit assemblies have been sold to end user customers.

The aforementioned problems experienced with sawn wafers are perpetuated if a solid band of PSA tape is used to secure IC chips within an adhesive backed carrier tape. Whereas IC chips in sawn wafers are generally picked and singulated within hours after sawing, IC chips placed in adhesive backed carrier tapes are usually packed, shipped and stored for weeks or months prior to removal at the assembly placement location.

From the foregoing, it is clear that new and improved means are needed to minimize adhesion of IC chips placed in adhesive backed carrier tapes, to enable ready removal during assembly placement of these IC chips by automated means even after many months of storage in carrier tapes prior to assembly use.

An improved method for minimizing adhesion of IC chips within adhesive backed carrier tapes is taught by the '143 Patent which is issued to the inventor and applicant of the present invention. The '143 Patent discloses a split rail configuration of adhesive backing affixed to a punched plastic carrier frame, wherein two parallel strips of PSA tape are utilized in lieu of one solid band of adhesive tape. These two parallel strips of PSA tape are separated by a gap of uniform width which is straddled by the IC chips affixed thereto. In this fashion, only partial surface contact of PSA tape to the back side of each IC chip is made, thus reducing total amount of adhesion and the requisite forces necessary to remove the chip from the adhesive backing.

It has been well demonstrated that adhesion levels needed to retain IC chips in position within adhesive backed carrier tapes and to avoid dislodging these chips during shipment and reeling and dereeling of the adhesive backed carrier tape is about 10% of the adhesion level required to maintain dimensional stability during wafer sawing operations. Exposing only a fraction of the backside of the IC chip to PSA tape when uniformly placed in sites along an adhesive backed carrier tape provides ample adhesion to maintain position of the IC chip on the adhesive backed carrier tape during shipment and storage, and simultaneously permits ready removal of the IC chip from the adhesive backed carrier tape during the assembly placement process.

The '143 Patent teaches that the gap spacing between the two parallel rails of PSA tape may be varied in proportion to chip size to provide optimum levels of adhesion for die of varied sawn dimensions which will span the gap between the two rails of PSA tape. IC chips with the same sawn dimensions are fixed to the two rails of PSA tape, span the gap between PSA tape rails and are positioned so that equal areas of the chip are captured by each rail of PSA tape. Under these conditions, a larger gap between the PSA tape rails will reduce adhesion, whereas a smaller gap will increase adhesion to the PSA tape rails.

In the real world of IC chip making, wafers are designed to maximize the number of IC chips on each wafer and the resulting yield therefrom. Accordingly, there are no industry standards defining sizes of IC chips as bare die, corresponding to the standardized and registered outlines of packages used to contain bare die affixed to lead frames or ball grid arrays, and assembled on printed circuit boards as packaged ICs. In view of the ongoing race for miniaturization in the electronics industry, demanding more features on smaller chips, development of industry standards for IC chip sizes is highly unlikely. As evidenced by molded plastic containers (a.k.a. waffle packs) with a plurality of identically sized cavities to contain IC chips within fixed boundaries, more than five thousand sizes of which are presently cataloged and sold, the sawn dimensions of IC chips vary at random and the variety will continue to increase. Herein lies major cost and inventory problems for packing IC chips in waffle packs and in conventional carrier tapes, both punched and embossed, all of which incorporate cavities of fixed dimensions. Since it is important to restrict free movement of IC chips to avoid damage to these delicate devices during shipment and handling and to provide some semblance of uniform orientation and repeatability in sequencing to enable retrieval by automated assembly machines, an undefinable variety and quantity of IC chip packing mediums with fixed cavity dimensions will be required to accommodate the continued down sizing of IC chip dimensions.

The need for cavities of fixed dimensions to fit each of the multitude of sawn IC chip sizes is eliminated by the adhesive backed carrier tape technology, wherein compartments comprise virtual boundaries, each capable of containing a wide range of IC chip sizes which are securely retained in fixed "as-placed" position by the PSA tape to which each chip is affixed. In the '143 Patent which employs two parallel strips or rails of PSA tape, a total of eight punched carrier tape sizes serve to accommodate chips from the smallest 6 mil to 8 mil transistors and diodes to the largest of the sophisticated microprocessor chips measuring up to 800×1400 mils in size. Compared with the market need for many thousands of die carriers containing cavities of fixed size dedicated to a specific chip size, and the cost and inventory problems associated therewith, adhesive backed carrier tape can reduce these problems by three orders of magnitude.

Although compartments in adhesive backed carrier tapes constitute virtual boundaries within which a wide range of IC chip sizes may be placed, a single gap spacing between the two rails of PSA tape may not serve the needs of all of the chip sizes which could be placed within each virtual boundary compartment. To the extent that multiple gap spacings between PSA tape rails are required on same size punched plastic carrier tapes, the versatility and interchangeability of use will be compromised.

Primarily on standardized adhesive backed punched plastic carrier tape frame which comprises 8 mm wide carrier with virtual boundary compartments sized to accommodate chips measuring from approximately nothing to 50 by 110 mils, several different gap spacings between PSA tape rails are utilized and will continue to be required. Adhesive backed carrier tapes containing two rails of PSA tape and intended for use with larger die sizes should require a lesser number of gap space variations, depending upon requirements of assembly placement machines, the tape feeders or de-reelers used in conjunction therewith, and the style and orientation of chips to be placed.

Whereas the technology taught by the '143 Patent to provide two split rails of PSA tape with a gap of controllable width between these PSA tape rails provides means to control adhesion of the chips to the PSA tapes to the minimum needed for secure retention during shipping and handling, thereby enhancing the ability to remove the chips during automated assembly processes without damage, mispicks, or disorientation, the edges of each strip rail of PSA tape to which chips are attached are defined as straight lines. It has been recognized that straight line edges of the PSA tape rails to which the chips are attached limit variations in adhesion level to only that which can be achieved by varying the gap dimension between the two parallel rails of PSA tape. In addition, it has been recognized that the edges of the two rails of PSA tape to which the chips are affixed can be cut in a variety of configurations—including, but not limited to sawtooth, fringe and sinusoidal patterns, both regular and irregular and that such configuration of PSA tape rail edges can further the benefits of controlling adhesion while simultaneously limiting the quantity and variety of gap spacings required between PSA tape rails, to achieve optimum adhesion of chips. In this context, "optimum adhesion" is defined as that which is just sufficient to secure chips to the adhesive backed carrier tape without dislodgement during shipping, handling or storage of the chips on the carrier tape, thereby allowing chips to be picked from the adhesive backed carrier tape without damage or disorientation.

It is desirable to provide a carrier tape system which includes an adhesive backed punched plastic carrier tape frame having a plurality of aperture cavities which are covered by a solid width of PSA tape affixed to the back side of the carrier tape frame, where the aperture cavities can accommodate a wide range of IC chip sizes within each virtual boundary compartment site within the punched carrier tape frame. It is also desirable to provide a carrier tape system which minimizes adhesion of IC chips placed within each aperture cavity of the punched carrier tape frame to enable ready removal during assembly placement of the IC chips.

SUMMARY OF THE INVENTION

The present invention is a carrier tape system for receiving, retaining and quickly releasing small components, such as singulated bare die, integrated circuit (IC) chips, or other small components for automated assembly processing.

The carrier tape system is comprised of a longitudinal elongated flexible punched carrier tape frame and a solid width of pressure sensitive adhesive (PSA) tape affixed to one side of the carrier tape frame. The punched carrier tape frame has a plurality of spaced apart aperture cavities therethrough. The solid width of PSA tape has a plurality of spaced apart configured apertures which are smaller than the plurality of aperture cavities of the punched carrier tape frame. These configured apertures of the PSA tape are centrally aligned and respectively located within the aperture cavities of the carrier tape frame. The perimeter of each configured aperture has a plurality of small protruding tabs which extend inwardly into each configured aperture for receiving, retaining and quickly releasing the small components therein. These small protruding tabs minimize adhesive contact to the small components contained within the aperture cavities of the carrier tape frame, and thereby allow quick release of the small components from the aperture cavities.

By their very nature, silicon chips are light weight, low mass objects which do not require very much adhesion to hold them in place. It follows that the weight and calculated mass of chips are generally proportional to area defined by X-Y dimensions, with some allowance for variations in chip thickness and the addition or absence of solder bumps. Accordingly, smaller and thus lighter chips require fewer and smaller protruding tabs (less adhesion) to hold them in place, whereas larger heavier chips require more and larger protruding tabs (more adhesion) to hold them in place.

It is an object of the present invention to provide a carrier tape system for receiving, retaining and quickly releasing small components, wherein the carrier tape system includes a punched carrier tape frame and a solid width of PSA tape affixed to one side of the carrier tape frame which encloses a plurality of aperture cavities of the carrier tape frame, where the PSA tape also has a plurality of configured apertures which are centrally located and aligned with the plurality of aperture cavities of the carrier tape frame. Each configured aperture has a set of protruding tabs for retaining and minimizing the adhesion to the small component placed within each aperture cavity of the carrier tape frame to enable ready removal during assembly placement of the small components by automated means.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
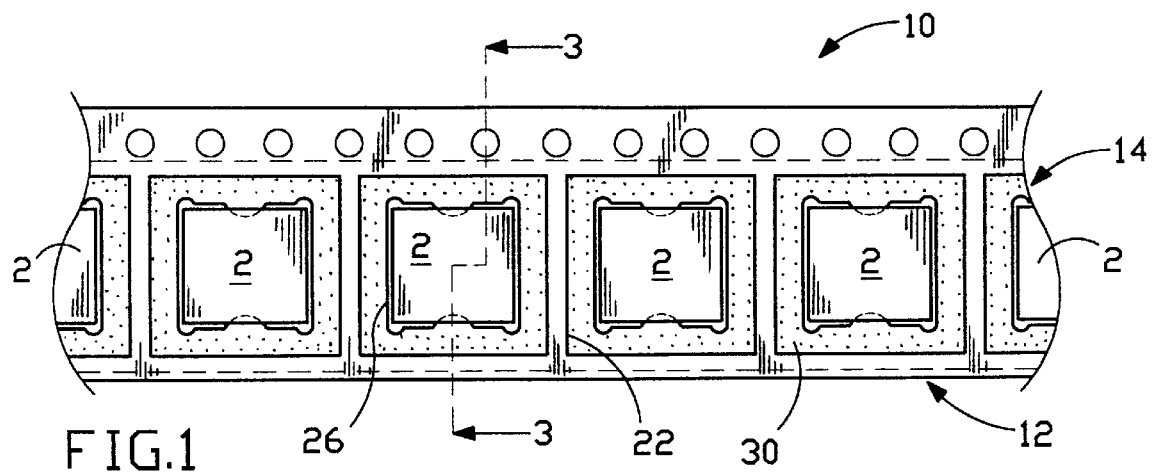
FIG. 1 is a top plan view of one embodiment of the present invention carrier tape system, with small, lighter components contained therein.

Referring to FIG. 1, there is depicted a top plan view of one embodiment of the present invention carrier tape system for receiving, retaining and quickly releasing small components 2 such as singulated bare die, integrated circuit (IC) chips, surface-mounted devices (SMDs) or other leadless electronic components.

Figure 2:
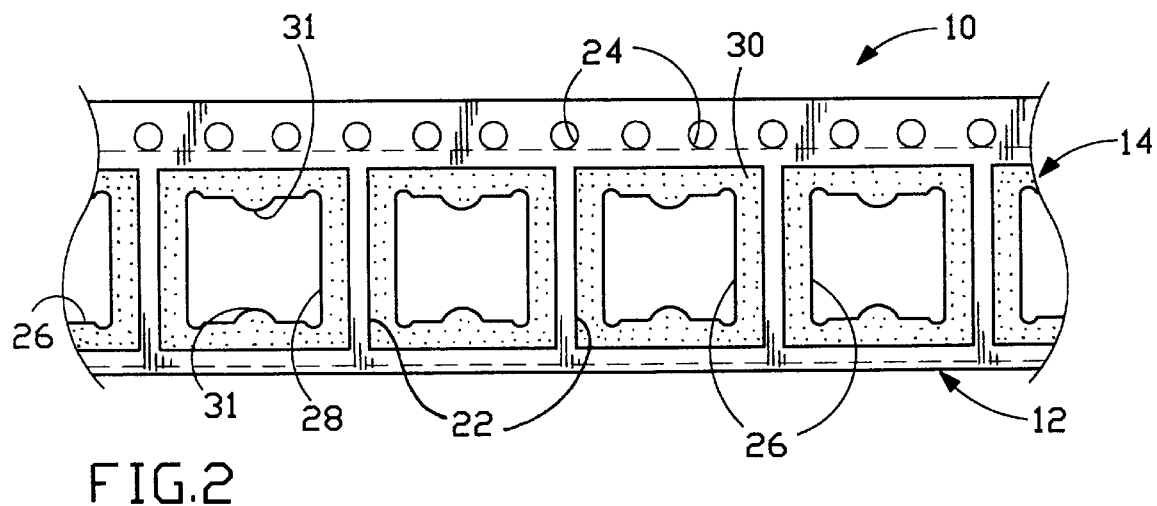
FIG. 2 is a top plan view of the present invention carrier tape system shown in FIG. 1, without the small, lighter components therein.
Figure 3:
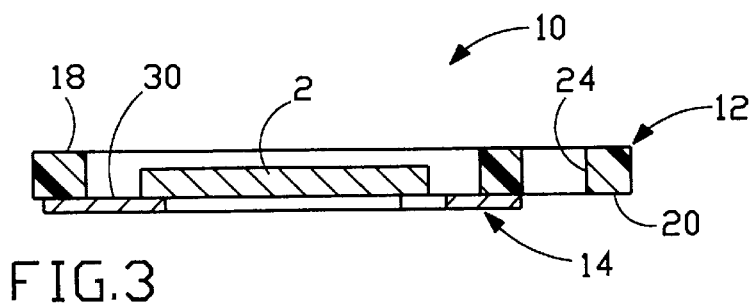
FIG. 3 is a cross-sectional view taken along line 3—3 of FIG. 1.

Referring to FIGS. 1, 2 and 3, the present invention carrier tape system 10 comprises a longitudinal elongated flexible punched carrier tape frame 12 and a longitudinal elongated width of pressure sensitive adhesive (PSA) tape 14. The punched carrier tape frame 12 is a smooth ribbon like film, usually made of plastic or paper or any suitable thick flexible high strength material, e.g., Surftape® which is manufactured by Tempo Electronics, Los Angeles, Calif. The punched carrier tape frame 12 has a front side 18, a back side 20, a plurality of spaced apart aperture cavities 22 which form a hexahedron shaped volume region, and a plurality of spaced apart sprocket drive holes 24 for controllably reeling the carrier tape frame 12 through a dispensing system (not shown) and also serve as alignment means for coordinating the movement of the carrier tape frame 12 and a pick and place tool (not shown). The thickness of the punched carrier tape frame 12 defines the thickness of the aperture cavities 22 punched therein. The length, width and thickness of an individual aperture cavity 22 is generally dependent on the pitch of the aperture cavities 22 to the sprocket drive holes 24 as well as the nature and dimensions of the component to be placed within the aperture cavity 22. The hexahedron shaped volume region of the aperture cavities 22 on a 2 mm pitch in 8 mm wide carrier tape frame 12 can have dimensions approximately sixty (60) mils in length, by one hundred twenty (120) mils in width, by thirteen (13) mils in depth to contain components as small as eight (8) to ten (10) mils square by five (5) to six (6) mils thick, in addition to larger components ranging up to approximately 90% of the aperture cavity dimensions. Some of the normal ranges for the punched carrier tape frame 12 thickness and resulting aperture cavity depth is of the order of ten (10) to thirteen (13) mils at a shallow depth, and sixty (60) or seventy (70) mils for the thicker cavity material. In most applications, the thickness of the punched carrier tape frame 12 will be greater than the thickness of the small component which is to be retained to protect the component from damage by adjacent layers of the punched carrier tape when spooled.

However, the thickness of the punched carrier tape frame 12 may be less than the thickness of the component to be retained, thereby allowing the retained component to protrude above the surface of punched carrier tape frame 12 for certain automated handling and processing needs.

The punched carrier tape frame 12 can be used in high speed manufacturing processes, where a continuous reel of small components 2 are retained in the aperture cavities 22 and are sequentially indexed to a specific position or dead spot by the processing machinery. In order to feed the punched carrier tape frame 12 forward, accurately indexing the punched carrier tape frame 12 forward an exact distance, the sprocket drive holes 24 of the punched carrier tape frame 12 engage gear teeth of a drive wheel or the probe of a lateral pawl of the processing machinery (typically, a tape feeder) which synchronizes the translation of the punched carrier tape frame 12 with the action of other processing machinery such as the vacuum tip arm of a pick-and-place assembly system. By way of example, the geometry of the aperture cavity 22 may assume any convenient shape suitable for component retention, such as rectangular, round or oval.

The PSA tape 14 comprises an adhesive surface 30 and a plurality of spaced part configured apertures 26. The PSA tape 14 with its adhesive surface 30 is affixed to the back side 20 of the carrier tape frame 12 such that it covers the plurality of aperture cavities 22 of the carrier tape frame 12. The configured apertures 26 are respectively located and centrally aligned within the plurality of aperture cavities 22 of the carrier tape frame 12. The configured apertures 26 are smaller than the aperture cavities 22 of the carrier tape frame 12, where each configured aperture 26 has a periphery 28 with a set of at least two opposite small protruding tabs 31 which face inwardly and extend partially into the configured aperture 26. The set of at least two protruding tabs 31 are adhered to the back side of the small component 2 for minimizing the adhesion to each small component 2 to be retained in each aperture cavity 22 of the carrier tape frame 12 and also for facilitating the removal of each small component 2 within the aperture cavity 22 of the carrier tape frame 12. The PSA tape 14 can be any of a variety of flexible pressure adhesive tapes which are well known in the art. With the protruding tabs 31 of varied size, a range of shape and location, adhesion levels can be achieved with the PSA tape 14.

By their very nature, silicon chips are light weight, low mass objects which do not require very much adhesion to hold them in place. It follows that the weight and calculated mass of IC chips 2 and 3 are generally proportional to area defined by X-Y dimensions, with some allowance for variations in IC chip thickness and the addition or absence of solder bumps (active side). Accordingly, smaller and thus lighter IC chips may require only two protruding tabs 31 (less adhesion) to hold them within the aperture cavity 22 (see FIG. 1), whereas larger, heavier IC chips 3 may require a plurality of protruding tabs 31 (more adhesion) to hold them within the aperture cavity 22 (see FIGS. 4 and 5).

Figure 4:
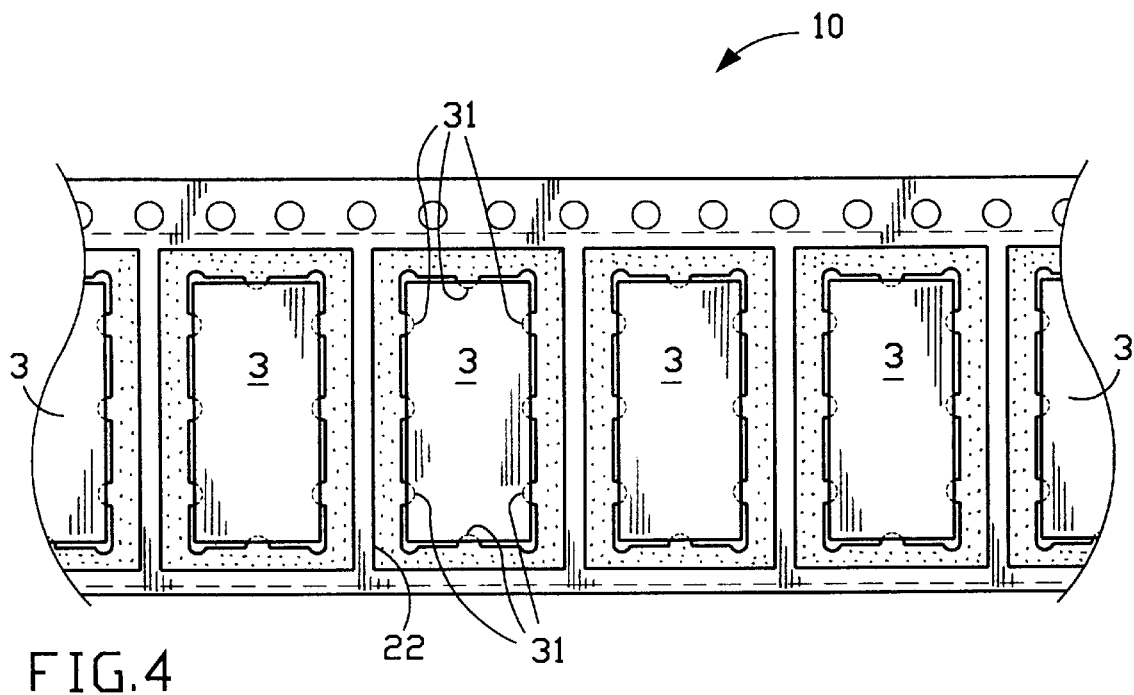
FIG. 4 is a top plan view of another embodiment of the present invention carrier tape system shown in FIG. 1, with larger, heavier components contained therein.

As depicted in FIG. 1, the smaller, lighter IC chips 2 are held within each aperture cavity 22 by only two opposite protruding tabs 31, and barely contact the back side of the IC chip 2, thereby providing a low or minimum adhesion. As depicted in FIG. 4, the larger, heavier IC chips 3 are held within each aperture cavity 22 by a plurality of opposing protruding tabs 31, where more of their back side area is in contact with the protruding tabs 31, with resultant increase in adhesion to properly retain these larger, heavier IC chips 3 within the punched carrier tape frame 12.

Referring to FIG. 3, when the small component 2 is placed into the aperture cavity 22, the small component 2 is supported at the bottom of the aperture cavity 22 by the protruding tabs 31 of the PSA tape 14 with the adhesive surface 30 coming in intimate contact with the underside of the small components 2. The small component 2 has a width, a length and a depth. By way of example, the component may assume any shape independent of the shape of the aperture cavity 22, such as rectangular, round or oval.

The present invention reduces the amount of mechanical force required to release small components 2 and large components 3 from the PSA tape 14, thereby minimizing potential damage to the components. In addition, the present invention provides the means to obtain a uniform, consistent level of adhesion for each component to be removed sequentially from the aperture cavity 22 of the punched carrier tape frame 12, further enabling repeatable pickup of components at high rates of speed. Those who are skilled in the art of integrated circuit technology appreciate the reduction of manufacturing variance, at any stage of integrated circuit processing and assembly, because the overall reduction of variance leads to lower failure rates, higher overall yield, extended performance lifetimes and increased reliability of the fully functional integrated circuit when installed.

In general, the procedure for packaging the small components 2 using the punched carrier tape frame 12 and the PSA tape 14 is as follows. First, the punched carrier tape frame 12 is prepared with a plurality of aperture cavities 22 which are large enough to contain the small components 2. The PSA tape 14 is then affixed to the back side 20 of the carrier tape frame 12. This PSA tape 14, comprising a solid strip width of continuous length may be prepunched with a plurality of configured apertures 26 prior to installation on the back side 20 of the carrier tape frame 12. For high accuracy and position consistency, the PSA tape 14 should be punched with a plurality of configured aperture 26 after installation on the back side 20 of the carrier tape frame 12. Punching configured apertures 26 after installation of the PSA tape 14 will assure precise positioning and sequencing of the configured apertures 26 (and thus the components 2 and 3 placed thereon) in lock step with the plurality of sprocket drive holes 24, the holes comprising the datum reference for repeatable, sequential positioning of components 2 and 3 at the pick point.

A completed carrier tape system 10, less components, has thus been constructed as previously described. The completed carrier tape system 10 is next wound in predetermined lengths onto a supply reel and fed into a carrier tape transport mechanism, akin to a tape feeder, whereby the carrier tape system 10 may be precisely indexed incrementally to sequentially position each aperture cavity 22 at a predetermined placement position, aka dead spot. A die transfer system, commonly referred to as a die attach or die sorting machine is employed to transfer bare die from a full IC wafer which has been previously sawn to singulate each die within the wafer. Typically, an array of die eject needles are used to release individual die from the adhesive backing covering the entire back side of the sawn wafer. Plunge-up of the die eject needles is synchronized with action of a vacuum probe or alternate mechanical means to pick the singulated die from the IC wafer array and transport the die with an appropriate transfer arm supporting the vacuum probe with die affixed thereto and to position the die directly above the dead spot placement position where the die is then precisely placed within the aperture cavity 22 of the carrier tape frame 12 and fixed with a preset downward force to firmly seat the die onto the protruding tabs 31 of the PSA tape 14.

After the small components 2 are placed into the aperture cavities 22, the small components 2 are in position for further processing and assembly placement. Subsequently, the component will be positioned for ready release and removal from the aperture cavity 22 by means of the vacuum pipette or other mechanical lifting means at a fixed pick point. The carrier tape can be wound on a reel from which it can be unwound for subsequent use.

In FIGS. 2 and 4, each set of protruding tabs are shown oppositely disposed from each other. It is also within the spirit and scope of the present invention to have each set of protruding tabs offset from each other.

Figure 5:
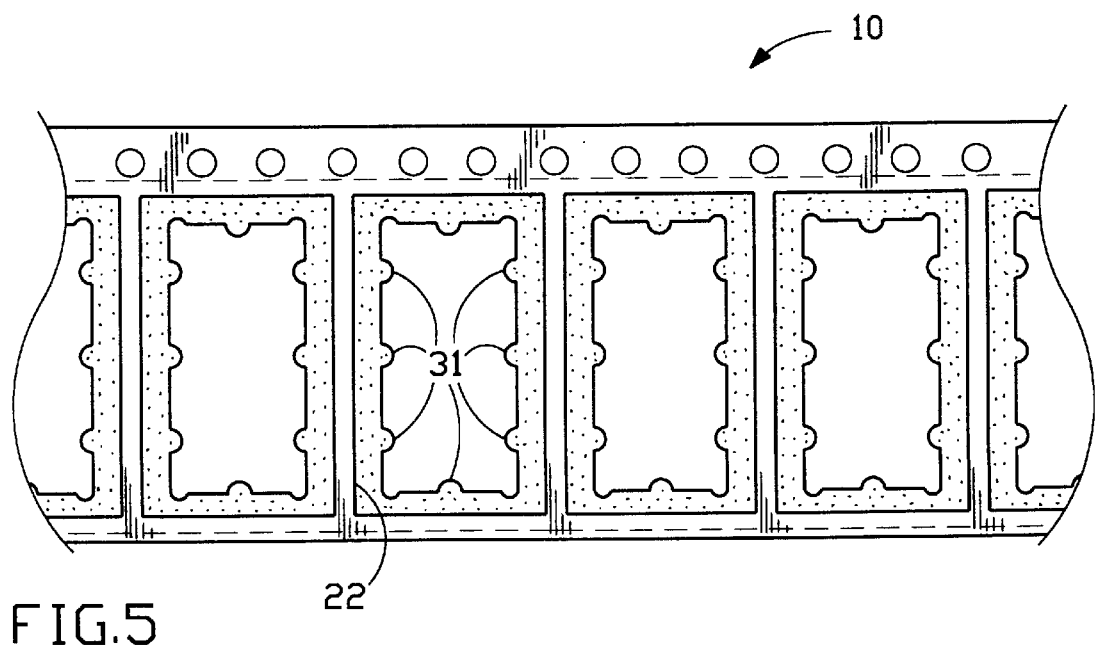
FIG. 5 is a top plan view of present invention carrier tape system shown in FIG. 4, without the larger, heavier components therein.

In FIGS. 4 and 5, provisions for larger and heavier components 3 (such as IC chips) are depicted, with a plurality of protruding tabs shaped and sized to accommodate these larger components 3. The foregoing descriptions referencing smaller, lighter IC chips 2 and small components 2 is equally applicable to the larger, heavier IC chips 3 and larger components 3 as depicted in FIG. 4 (components in place) and FIG. 5 (carrier tape system 10, less components).

The present invention carrier tape system is used for orderly sequential arrangements of small flat components or the like, especially electronic components for automated surface mount assembly. In particular, singulated bare die is obtained from sawn integrated circuit wafers in preparation for further testing, inspection, marking or other processing if and as required, and, ultimately, for assembly/placement upon circuit board substrates by high speed automated pick-and-place means.

Defined in detail, the present invention is a carrier tape system for receiving, retaining and quickly releasing small components, the system comprising: (a) a longitudinally elongated punched carrier tape frame having a front side, a back side and a plurality of spaced apart aperture cavities for respectively accommodating the small components; (b) a longitudinally elongated width of pressure sensitive adhesive tape having an adhesive surface affixed to the back side of the carrier tape frame and covering the plurality of aperture cavities, the pressure sensitive adhesive tape further having a plurality of spaced apart configured apertures which are smaller than and respectively located and centrally aligned within the plurality of aperture cavities of the carrier tape frame; and (c) each configured aperture having a periphery with a set of a plurality of spaced apart protruding tabs facing inwardly for minimal adhesioning to each small component to be retained in each aperture cavity of the carrier tape frame and for minimizing the adhesion to each small component and for facilitating the removal of each small component within each aperture cavity of the carrier tape frame; (d) whereby the small components are respectively retained within the plurality of aperture cavities by each set of the plurality of protruding tabs which also facilitate the removal of the small components from the plurality of aperture cavities of the carrier tape frame.

Defined broadly, the present invention is a carrier tape system for receiving, retaining and quickly releasing small components, the system comprising: (a) a longitudinal punched carrier tape frame having a side and a plurality of aperture cavities for respectively accommodating the small components; (b) a longitudinal pressure sensitive adhesive tape having an adhesive surface affixed to the side of the carrier tape frame and covering the plurality of aperture cavities, the pressure sensitive adhesive tape further having a plurality of configured apertures which are smaller than and respectively located and centrally aligned within the plurality of aperture cavities of the carrier tape frame; and (c) each configured aperture having a periphery with a set of at least two protruding tabs facing inwardly for minimal adhesioning to each small component to be retained in each aperture cavity of the carrier tape frame and for minimizing the adhesion to each small component and facilitating the removal of each small component within each aperture cavity of the carrier tape frame; (d) whereby the small components are respectively retained within the plurality of aperture cavities by each set of the at least two protruding tabs which also facilitate the removal of the small components from the plurality of aperture cavities of the carrier tape frame.

Defined more broadly, the present invention is a system for receiving, retaining and quickly releasing small components, comprising: (a) a longitudinal carrier tape frame having a plurality of aperture cavities for respectively accommodating the small components; (b) a longitudinal adhesive tape having an adhesive surface affixed to the carrier tape frame and covering the plurality of aperture cavities, the adhesive tape further having a plurality of apertures which are respectively located within the plurality of aperture cavities of the carrier tape frame; and (c) each aperture of the adhesive tape having a periphery with a set of at least two protruding tabs for minimal adhesioning to each small component to be retained in each aperture cavity of the carrier tape frame and for minimizing the adhesion to each small component and facilitating the removal of each small component within each aperture cavity of the carrier tape frame; (d) whereby the small components are respectively retained within the plurality of aperture cavities by each set of the at least two protruding tabs which also facilitate the removal of the small components from the plurality of aperture cavities of the carrier tape frame.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A carrier tape system for receiving, retaining and quickly releasing small components, the system comprising:
   a. a longitudinally elongated punched carrier tape frame having a front side, a back side and a plurality of spaced apart aperture cavities for respectively accommodating said small components;
   b. a longitudinally elongated width of pressure sensitive adhesive tape having an adhesive surface affixed to said back side of said carrier tape frame and covering said plurality of aperture cavities, the pressure sensitive adhesive tape further having a plurality of spaced apart configured apertures which are smaller than and respectively located and centrally aligned within said plurality of aperture cavities of said carrier tape frame; and
   c. said each configured aperture having a periphery with a set of a plurality of spaced apart protruding tabs facing inwardly for minimal adhesioning to said each small component to be retained in said each aperture cavity of said carrier tape frame and for minimizing the adhesion to said each small component and for facilitating the removal of said each small component within said each aperture cavity of said carrier tape frame;
   d. whereby said small components are respectively retained within said plurality of aperture cavities by said each set of said plurality of protruding tabs which also facilitate the removal of said small components from said plurality of aperture cavities of said carrier tape frame.

2. The carrier tape system in accordance with claim 1 wherein said plurality of spaced apart configured apertures are shaped, sized and proportioned to fit the exact geometry of the component to be affixed thereon.

3. The carrier tape system in accordance with claim 1 wherein each set of protruding tabs are oppositely disposed.

4. The carrier tape system in accordance with claim 1 wherein each set of protruding tabs are offset from each other.

5. The carrier tape system in accordance with claim 1 wherein said plurality of aperture cavities of said carrier tape frame are hexahedron shaped.

6. The carrier tape system in accordance with claim 1 wherein said carrier tape frame is made from plastic.

7. The carrier tape system in accordance with claim 1 wherein said carrier tape frame includes a plurality of spaced apart sprocket drive holes for engaging gear teeth of a drive wheel.

8. The carrier tape system in accordance with claim 1 wherein said carrier tape frame can be wound on a reel from which it can be unwound for subsequent use.

9. A carrier tape system for receiving, retaining and quickly releasing small components, the system comprising:
   a. a longitudinal punched carrier tape frame having a side and a plurality of aperture cavities for respectively accommodating said small components;
   b. a longitudinal pressure sensitive adhesive tape having an adhesive surface affixed to said side of said carrier tape frame and covering said plurality of aperture cavities, the pressure sensitive adhesive tape further having a plurality of configured apertures which are smaller than and respectively located and centrally aligned within said plurality of aperture cavities of said carrier tape frame; and
   c. said each configured aperture having a periphery with a set of at least two protruding tabs facing inwardly for minimal adhesioning to said each small component to be retained in said each aperture cavity of said carrier tape frame and for minimizing the adhesion to said each small component and facilitating the removal of said each small component within said each aperture cavity of said carrier tape frame;
   d. whereby said small components are respectively retained within said plurality of aperture cavities by said each set of said at least two protruding tabs which also facilitate the removal of said small components from said plurality of aperture cavities of said carrier tape frame.

10. The carrier tape system in accordance with claim 9 wherein each set of protruding tabs are oppositely disposed.

11. The carrier tape system in accordance with claim 9 wherein each set of protruding tabs are offset from each other.

12. The carrier tape system in accordance with claim 9 wherein said plurality of aperture cavities of said carrier tape frame are hexahedron shaped.

13. The carrier tape system in accordance with claim 9 wherein said carrier tape frame is made from plastic.

14. The carrier tape system in accordance with claim 9 wherein said carrier tape frame includes a plurality of spaced apart sprocket drive holes for engaging gear teeth of a drive wheel.

15. The carrier tape system in accordance with claim 9 wherein said carrier tape frame can be wound on a reel from which it can be unwound for subsequent use.

16. A system for receiving, retaining and quickly releasing small components, comprising:
   a. a longitudinal carrier tape frame having a plurality of aperture cavities for respectively accommodating said small components;
   b. a longitudinal adhesive tape having an adhesive surface affixed to said carrier tape frame and covering said plurality of aperture cavities, the adhesive tape further having a plurality of apertures which are respectively located within said plurality of aperture cavities of said carrier tape frame; and
   c. said each aperture of said adhesive tape having a periphery with a set of at least two protruding tabs for minimal adhesioning to said each small component to be retained in said each aperture cavity of said carrier tape frame and for minimizing the adhesion to said each small component and facilitating the removal of said each small component within said each aperture cavity of said carrier tape frame;
   d. whereby said small components are respectively retained within said plurality of aperture cavities by said each set of said at least two protruding tabs which also facilitate the removal of said small components from said plurality of aperture cavities of said carrier tape frame.

17. The system in accordance with claim 16 wherein each set of protruding tabs are oppositely disposed.

18. The system in accordance with claim 16 wherein each set of protruding tabs are offset from each other.

19. The system in accordance with claim 16 wherein said plurality of aperture cavities of said carrier tape frame are hexahedron shaped.

20. The system in accordance with claim 16 wherein said carrier tape frame is made from plastic.

21. The system in accordance with claim 16 wherein said carrier tape frame includes a plurality of sprocket drive holes for engaging gear teeth of a drive wheel.

22. The system in accordance with claim 16 wherein said carrier tape frame can be wound on a reel from which it can be unwound for subsequent use.

* * * * *